United States Patent [19]

Long et al.

[11] Patent Number: 5,710,990
[45] Date of Patent: Jan. 20, 1998

[54] TRANSMITTER WHICH ADJUSTS PEAK-TO-AVERAGE POWER OF A MULTICARRIER SIGNAL BY SWITCHING BETWEEN A GROUP OF CHANNELS AND A PHASE-ADJUSTED GROUP OF CHANNELS

[75] Inventors: James Frank Long, Glen Ellyn, Ill.; Yuda Y. Luz, Eules, Tex.

[73] Assignee: Motorola, Inc., Schaumburg, Ill.

[21] Appl. No.: 619,391

[22] Filed: Mar. 21, 1996

[51] Int. Cl.⁶ .................. H04B 1/02; H01Q 11/12; H01Q 1/04
[52] U.S. Cl. .................................... 455/103; 455/116
[58] Field of Search .......................... 455/103, 116, 455/13.4, 101, 115

[56] References Cited

U.S. PATENT DOCUMENTS

| | | | |
|---|---|---|---|
| 5,128,964 | 7/1992 | Mallory | 375/39 |
| 5,157,346 | 10/1992 | Powell et al. | 330/151 |
| 5,201,071 | 4/1993 | Webb | 455/101 |
| 5,302,914 | 4/1994 | Arntz et al. | |
| 5,349,300 | 9/1994 | Matz et al. | |
| 5,381,449 | 1/1995 | Jasper et al. | |
| 5,420,541 | 5/1995 | Upton et al. | 330/286 |
| 5,646,631 | 7/1997 | Arntz | 342/373 |

OTHER PUBLICATIONS

Minimisation of the Peak to Mean Envelope Power Ratio of Multicarrier Transmission Schemes by Block Coding by T. A. Wilkinson, Hewlet Packard Lab., and A. E. Jones, Motorola UK, pp. 1-15.

*Primary Examiner*—Amelia Au
*Assistant Examiner*—David R. Vincent
*Attorney, Agent, or Firm*—Jeffrey G. Toler; Richard A. Sonnentag

[57] ABSTRACT

An apparatus (10) for adjusting peak-to-average power of a multicarrier signal. The apparatus (10) comprises a first (26) and second (28) combiner, a phase-changing device (30), and a switch (36). The first combiner (26) receives a first group of channels (20) and a second group of channels (22) and produces a first combined signal (46). The phase-changing device (30) receives the first group of channels (20) and produces a group of phase-adjusted channels. The second combiner (28) receives the phase-adjusted channels and the second group of channels (22) and produces a second combined signal (48), and the switch (36) responds to the first (26) and second (28) combiners and selects at least one of the first (46) and second (48) combined signals.

22 Claims, 3 Drawing Sheets

TRANSMITTER WHICH ADJUSTS PEAK-TO-AVERAGE POWER OF A MULTICARRIER SIGNAL BY SWITCHING BETWEEN A GROUP OF CHANNELS AND A PHASE-ADJUSTED GROUP OF CHANNELS

FIELD OF THE INVENTION

The present invention relates generally to communications, and more particularly to a method and apparatus for transmitting a peak-adjusted multicarrier signal.

BACKGROUND OF THE INVENTION

Wireless communication systems employ various modulation methods to broadcast baseband information. In order to efficiently use available frequency spectrum, many communication systems transmit multiple radio frequency carriers. Before transmission, a multiple carrier signal is typically amplified by a power amplifier such as a linear power amplifier. When multiple radio frequency carriers are amplified by a common linear power amplifier, carrier voltages from the individual carriers add vectorially to produce signal amplitude variations generally referred to as a voltage envelope. Occasionally, due to phase alignment of the RF carriers, the voltage envelope achieves a peak value.

To prevent clipping of the voltage envelope at the peak value, the linear power amplifier should be designed to the maximum voltage envelope excursion at the peak value. Since the maximum power of the voltage envelope at the peak value may be many times greater than the average power of the voltage envelope, multicarrier linear power amplifiers are usually large, inefficient, and costly. In order to reduce the size and cost of a multicarrier linear power amplifier, it would be desirable to suppress the maximum peak value of the voltage envelope without materially reducing carrier power and without corrupting baseband information. Accordingly, there exists a need for a method and apparatus for transmitting a peak-adjusted multicarrier signal.

SUMMARY OF THE INVENTION

In order to address this need, the present invention provides an apparatus for adjusting peak-to-average power of a multicarrier signal, an apparatus for generating a multichannel peak-adjusted signal, and a multicarrier radio frequency transmitter.

The apparatus for adjusting peak-to-average power comprises a first and second combiner, a phase-changing device, and a switch. The first combiner receives a first group of channels and a second group of channels and produces a first combined signal. The phase-changing device receives the first group of channels and produces a group of phase-adjusted channels. The second combiner receives the phase-adjusted channels and the second group of channels and produces a second combined signal, and the switch responds to the first and second combiners and selects at least one of the first and second combined signals.

The apparatus for transmitting a multichannel peak-adjusted signal comprises a first and second frequency upconverter, a peak-adjusting device, a power amplifier responsive to the peak-adjusting device, and an antenna responsive to the power amplifier. The first frequency upconverter receives a first plurality of baseband signals and produces a first multicarrier radio frequency signal. The second frequency upconverter receives a second plurality of baseband signals and produces a second multicarrier radio frequency signal. The peak-adjusting device is responsive to the first and second frequency upconverters and the peak-adjusting device receives the first and second multicarrier radio frequency signals and produces the multichannel peak-adjusted signal.

The multicarrier radio frequency transmitter comprises a first and second radio frequency module, a peak-adjusting device, a power amplifier responsive to the peak-adjusting device, and an antenna responsive to the power amplifier. The first radio frequency module comprises a frequency upconverter providing a first signal that includes a first plurality of radio frequency channels. The second radio frequency module comprises a frequency upconverter providing a second signal that includes a second plurality of radio frequency channels. The peak-adjusting device is responsive to the first and second radio frequency modules, and the peak-adjusting device produces a multichannel peak-adjusted signal based on the first and second signals.

According to another aspect of the present invention, a method for adjusting peak-to-average power of a radio frequency signal is provided. The method includes the steps of combining a first group of radio frequency signals and a second group of radio frequency signals to produce a first combined signal; changing the phase of the first group of radio frequency signals to produce a group of phase-adjusted signals; combining the group of phase-adjusted signals and the second group of radio frequency signals to produce a second combined signal; selecting one of the first and second combined signals; and outputting the selected combined signal.

The invention itself, together with its attendant advantages, will best be understood, but is in no way limited, by reference to the following detailed description, taken in conjunction with the accompanying drawings.

DETAILED DESCRIPTION OF THE PREFERRED EMBODIMENT(S)

Figure 1:
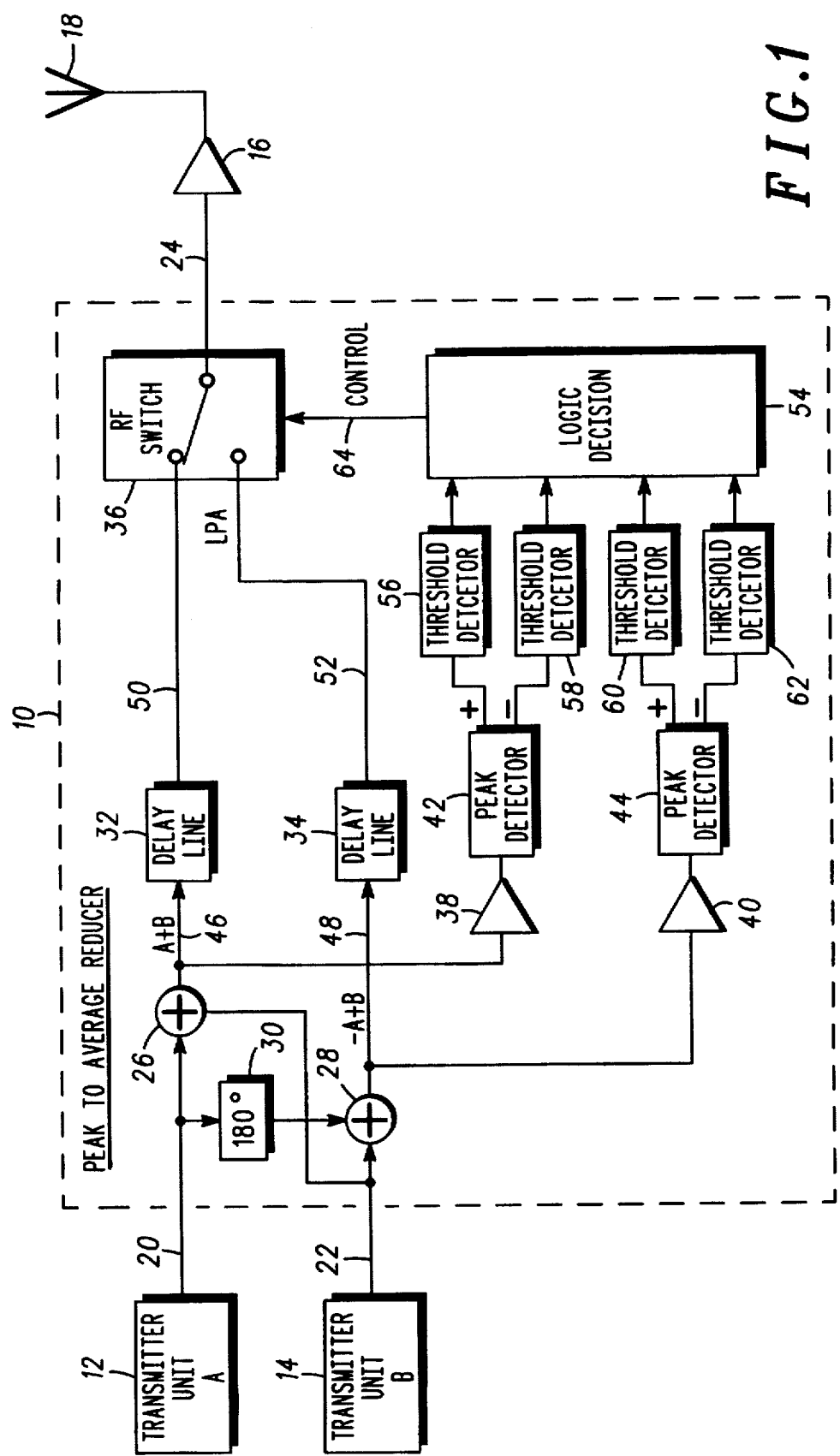
FIG. 1 is a block diagram of an apparatus for adjusting peak-to-average power of a multicarrier signal according to a preferred embodiment.

Referring to FIG. 1, an apparatus 10 for adjusting peak-to-average power of a multicarrier signal is illustrated. The apparatus 10 receives a first group of carrier signals 20 from a first input unit 12 and receives a second group of carrier signals 22 from a second input unit 14. The apparatus 10 outputs a peak-adjusted signal 24 which is amplified by a linear power amplifier 16 and transmitted by an antenna 18. The apparatus 10 for adjusting peak-to-average power includes a first summer 26, a second summer 28, a radio frequency (RF) switch 36, a phase-adjustment device 30, and first and second delay lines 32 and 34. The apparatus 10 also includes a first buffer 38, a second buffer 40, a first peak detector 42, a second peak detector 44, a logic decision unit 54, and threshold detectors 56, 58, 60 and 62. The first summer 26 is coupled to the RF switch 36 via the first delay line 32, and the second summer 28 is coupled to the RF switch 36 via the second delay line 34. The first summer 26 is coupled to the peak detector 42 via the first buffer 38, and the second summer 28 is coupled to the peak detector 44 via the second buffer 40. The peak detector 42 is coupled to the decision logic unit 54 via the threshold detectors 56 and 58, and the second peak detector 44 is similarly coupled to the decision logic unit 54 via the threshold detectors 60 and 62. The decision logic unit 54 is coupled to the RF switch 36 via a control line 64.

During operation the first group of carrier signals 20 are summed by the first summer 26 to form a summed signal A+B 46. The first group of carrier signals 20 are delayed by the phase-adjustment device 30 and then summed with the second group of carrier signals 22 at the second summer 28 to form a second summed signal labeled −A+B 48. The first summed signal 46 is delayed by the first delay line 32, preferably for about 20 nanoseconds (nsec), to produce a first delayed summed signal 50 which is fed into a first input of the RF switch 36. Similarly, the second summed signal 48 is delayed by the second delay line 34, preferably for about 20 nsec, to produce a second delayed summed signal 52 which is fed into a second input of the RF switch 36.

The first summed signal 46 is split and then fed into the first buffer 38 and passed to the peak detector 42. The peak detector 42 measures the peak power value of the first summed signal 46. Similarly, the second peak detector 44 measures the peak power of the second summed signal 48 after the second summed signal has been stored in buffer 40. The first peak detector 42 produces a positive and a negative peak value which are fed into the first and second threshold detectors 56 and 58, respectively, and then fed into the logic decision unit 54. Similarly, the second peak detector 44 produces both positive and negative peak measurements and feeds these measurements through the threshold detector 60 and 62 to the logic decision unit 54.

The logic decision unit module 54 responds to the peak measurements from the peak detectors 42 and 44 and the threshold detectors 56, 58, 60, and 62 and produces the control signal 64. Decision logic within the module 54 selects one of the inputs to the RF switch 34, either input signal 50 or input signal 52, via the control signal 64. In the preferred embodiment, the first input signal 50 is selected when the peak-to-average power of the summed signal 46 is less than the peak-to-average power of the second summed signal 48. The second input to the RF switch 52 is selected when the second summed signal 48 has a lower peak-to-average power then the first summed signal 46. However, in the preferred embodiment, when one of the inputs 50, 52 has been selected, the RF switch 36 will not transition to the other input 50, 52 for a predetermined length of time, such as from about 1 to about 3 nanoseconds.

It should also be noted that the control signal 64 should be produced by the decision logic module 54 before the delayed signals 50 and 52 are received by the RF switch 36. Thus, the combined delay from the buffers 38 and 40, peak detectors 42 and 44, threshold detectors 56, 58, 60, 62, and logic unit 54 is preferably less than or equal to the delay of delay lines 32 and 34. In the preferred embodiment, since the delay lines 32 and 34 provide a delay of 20 nsec, the control signal 64 is to be provided within 20 nsec after receiving the summed signals at the buffers 38 and 40.

The RF switch 36 in response to the control signal 64 selects and then outputs either the first input signal 50 or the second input signal 52. When the RF switch 36 outputs the second input signal 52 which is a delayed version of the second summed signal 48, the output signal 24 becomes the sum of the second group of input signals 22 and a phase-adjusted group of the first input signals 20.

The apparatus 10 shown in FIG. 1 generates two groups of multicarrier signals. One group of signals corresponds to the input signals, while the other group has a subset of signals in antiphase with the original signals. Because the two signal groups have different phase relationships, one of the two groups of signals has a lower peak-to-average ratio than the other for some time interval (assuming random frequency distribution). The group with the lowest peak to average ratio for a particular time period is selected by the switch 36 for transmission to the antenna.

The apparatus 10 preferably selects the signal group with the best peak-to-average ratio over many intervals in time, thereby producing a lower peak-to average ratio waveform at its output than is possible without the circuit. The preferred embodiment utilizes high speed logic and a high speed switch 36 to minimize time between switching events and switching duration. The decision logic algorithm within logic unit 54 is efficient and thereby reduces gate count and time delays. Although the preferred embodiment uses frequencies in antiphase, other phase adjustments are possible. The preferred embodiment adjusts the phase of half of the total signals. An alternative is to adjust one or more of the input signal phases.

Figure 2:
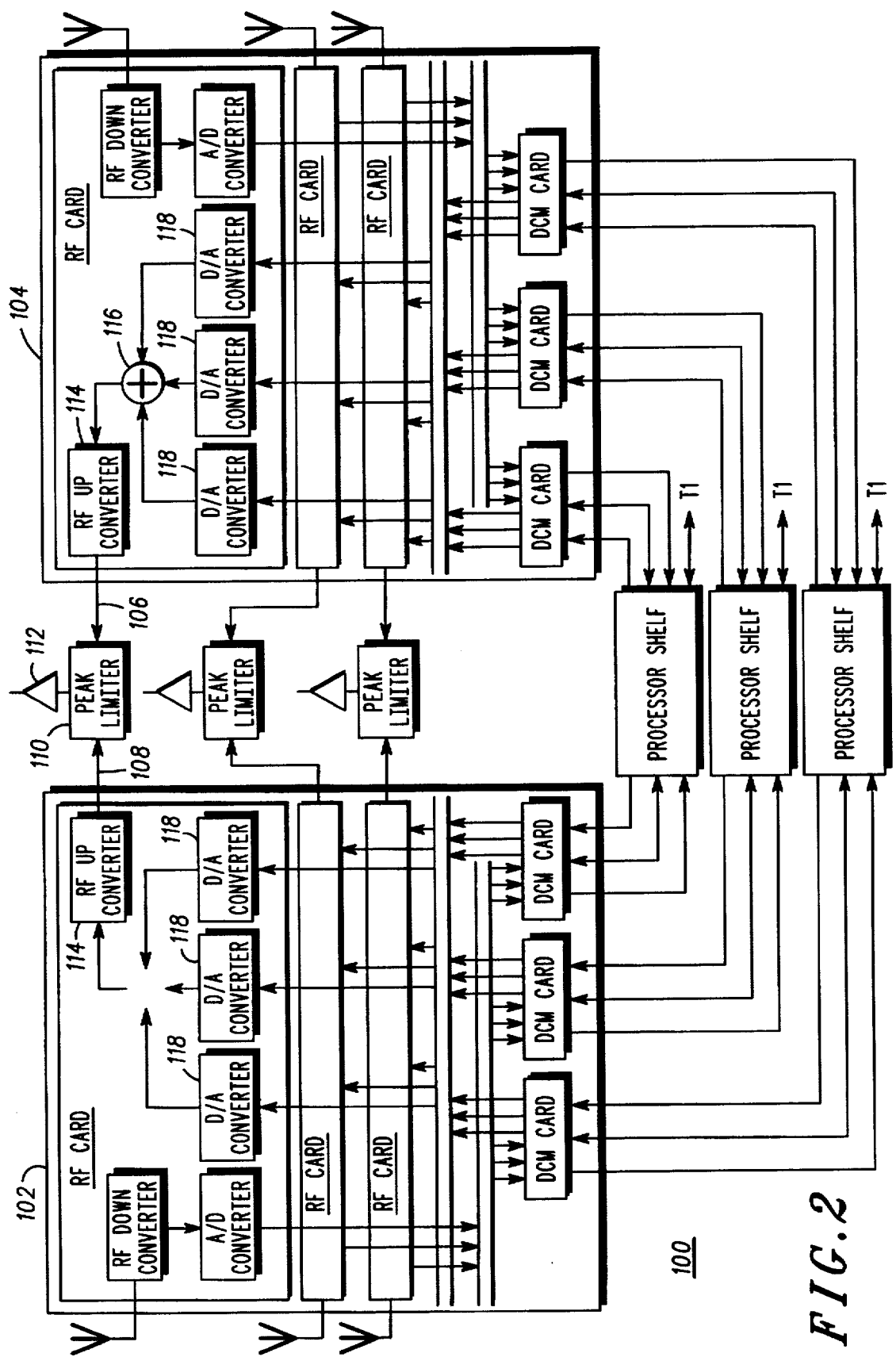
FIG. 2 is a block diagram of an apparatus for transmitting a multicarrier peak-adjusted signal according to a preferred embodiment.

Referring now to FIG. 2, a preferred embodiment of a multicarrier transmitter 100 is illustrated. The multicarrier transmitter 100 includes a first RF module 102, a second RF module 104, a peak limiter 110, and a power amplifier 112. Each of the RF modules 102 and 104 include a plurality of RF cards and each of the RF cards include an RF upconverter 114, a summer 116, and a plurality of digital-to-analog converters 118. Each of the digital-to-analog converters 118 receives a baseband signal and each of the baseband signals are preferably generated from a common timing device such as a synchronizing clock source. The summer 116 combines RF channels from the digital-to-analog converters 118 to produce a multicarrier signal. The output of the RF upconverter 114 is a multicarrier radio frequency upconverted signal 106.

The peak limiter 110 receives a first multicarrier radio frequency upconverted signal 108 from the first RF module 102 and receives a second multicarrier radio frequency upconverted signal 106 from the second RF module 102. The peak limiting device 110 outputs a peak adjusted multicarrier signal which is fed into the power amplifier 112 and transmitted by an antenna (not shown) responsive to the power amplifier 112. In the preferred embodiment the peak limiting device 110 is the apparatus for adjusting peak power 10 shown in FIG. 1.

The apparatus shown in FIG. 2 illustrates how the circuit 10 in FIG. 1 can be used in a wideband digital radio transmitter 100. As shown in FIG. 2, the wideband digital radio transmitter 100 can be partitioned into two channel platforms. This partitioning facilitates redundant mode fault tolerant operation in a wideband radio, and also can provide equal number of channels for the A+B and −A+B channel groups 46, 48. In the preferred wideband radio embodiment, the upconverted signals 106, 108 are input to the peak limiting circuit 110, and passed on to a multicarrier linear amplifier 112 and then on to an antenna for transmission. The wideband radio transmitter 100 also facilitates the generation of a synchronizing clock source, which is used to produce a fixed modulation phase state for each carrier over a given time interval. The peak limiting circuit described in FIG. 1 can also be applied to other multicarrier radio transceiver platforms and is not limited to the particular configuration of FIG. 2. Parameters used to select a suitable platform include channel partitioning, data rates, and carrier phase synchronization.

Figure 3:
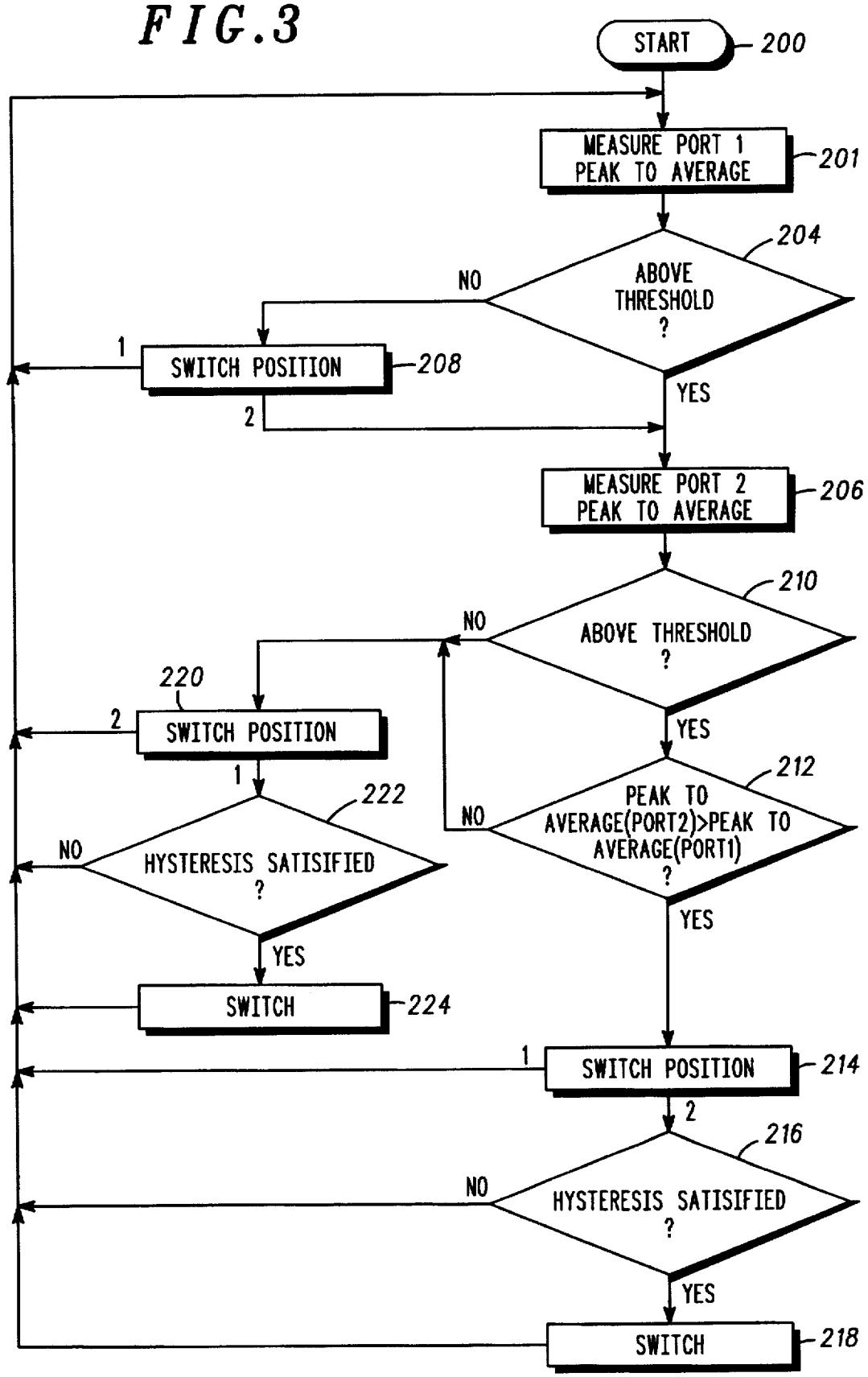
FIG. 3 is a flow chart of a method for controlling the switch of FIG. 1.

Referring to FIG. 3, a particular method of controlling the RF switch 36 of FIG. 1 by the decision logic unit 54 is illustrated. Processing begins at 200 and proceeds to step 201 where a peak-to-average power measurement is taken for port 1 receiving input signal 50 of the RF switch 36. The peak-to-average power measurment for port 1 is compared to a threshold, at decision step 204. If the peak-to-average power measurement for port 1 is greater than the threshold, a peak-to-average measurement is performed for port 2 of the RF switch 36, receiving input signal 52, at step 206. Otherwise, the RF switch position, either port 1 or port 2, is checked at decision step 208. If the current port is port 1, then processing returns to step 202. If the current switch position is port 2, then processing proceeds to step 206.

Similarly, the measurement for port 2 is compared to a threshold, at decision step 210. If the measurement for port 2 is less than the threshold then the position of RF switch 36 is checked, at step 220. If the current selected port at switch 36 is port 2 then processing is continued back at step 202. If the current selected port is port 1, then a hysteresis condition is checked, at step 222. If the hysteresis condition is satisfied and after a suitable time delay, such as from about 1 to about 3 nanoseconds, then the RF switch 36 is switched from port 1 to port 2, at step 224 before returning to step 202. If the hysteresis condition is not satisfied, then processing continues at step 202 without a port switch.

Returning to step 210, if the measurement for port 2 exceeds the threshold and if the peak-to-average measurement for port 2 is greater than the peak-to-average measurement for port 1, step 212, then the current port is checked, at step 214. If the current port is port 2 then hysteresis is checked at step 216, and if hysteresis is satisfied the port is switched from port 2 to port 1, at step 218, and processing continues back at step 202. If hysteresis is not satisfied, at step 216, then processing continues at step 202 without performing a port switch.

Many advantages and modifications of the above described apparatus and method will readily occur to those skilled in the art. The invention, in its broader aspects, is therefore not limited in any manner to the specific details, representative apparatus, and illustrative examples shown and described above. Various modifications and variations can be made to the above specification without departing from the scope or spirit of the present invention, and it is intended that the present invention cover all such modifications and variations provided they come within the scope of the following claims and their equivalents.

What is claimed is:

1. An apparatus for adjusting peak-to-average power of a multicarrier signal, the apparatus comprising:
   a first combiner responsive to a first group of channels and a second group of channels and producing a first combined signal;
   a phase-changing device responsive to the first group of channels and producing a group of phase-adjusted channels;
   a second combiner responsive to the phase-adjusted channels and the second group of channels and producing a second combined signal; and
   a switch responsive to the first and second combiners, the switch selecting one of the first and second combined signals.

2. The apparatus of claim 1, further comprising a detector measuring a first peak value of the first combined signal and measuring a second peak value of the second combined signal.

3. The apparatus of claim 2, wherein the switch selects one of the first and second channels based on at least one of the first and second peak values.

4. The apparatus of claim 1, further comprising a power amplifier responsive to the switch.

5. The apparatus of claim 1, further comprising a delay device coupling the first combiner and the switch.

6. The apparatus of claim 1, wherein the detector comprises a peak detector.

7. The apparatus of claim 6, wherein the detector further comprises a threshold detector responsive to the peak detector.

8. The apparatus of claim 1, wherein the detector comprises a logic unit and said detector provides a control signal and the switch is responsive to the control signal.

9. The apparatus of claim 1, wherein the first group of channels includes a group of radio frequency signals.

10. An apparatus for generating a multichannel peak-adjusted signal, the apparatus comprising:
    a first combiner receiving a first group of channels and producing a first multicarrier signal;
    a second combiner receiving a second group of channel and producing a second multicarrier signal;
    phase changing means for changing the phase of said first group of channels;
    a peak-adjusting device which controls an RF switch and is responsive to the first and second combiners, the peak-adjusting device receiving the first and second multicarrier signals and producing the multichannel peak-adjusted signal.

11. The apparatus of claim 10, further comprising a power amplifier responsive to the peak-adjusting device; and an antenna responsive to the power amplifier.

12. The apparatus of claim 10, wherein the first and second plurality of channels are generated from a common timing device.

13. The apparatus of claim 10, wherein the first combiner comprises a frequency upconverter.

14. The apparatus of claim 10, further comprising a processor, the first and second combiners responsive to the processor.

15. The apparatus of claim 14, wherein the processor produces at least a portion of the first and second signals.

16. A multicarrier radio frequency transmitter comprising:
    a first radio frequency module comprising a frequency upconverter providing a first signal, the first signal comprising a first plurality of radio frequency channels;
    a second radio frequency module comprising a frequency upconverter providing a second signal, the second signal comprising a second plurality of radio frequency channels;
    a peak-adjusting device responsive to the first and second radio frequency modules, the peak-adjusting device producing a multichannel peak adjusted signal based on the first and second signals;
    a power amplifier responsive to the peak-adjusting device; and
    an antenna responsive to the power amplifier;
    a first combiner receiving the first and second signals and producing a first combined signal;
    a phase-changing device receiving the first signal and producing a phase-adjusted signal;
    a second combiner receiving the phase-adjusted signal and the second signal and producing a second combined signal; and a switch responsive to the first and second combiners, the switch selecting one of the first and second combined signals.

17. The multicarrier radio frequency transmitter of claim 16, wherein the multichannel peak-adjusted signal has a frequency band greater than a frequency band of at least one of the first plurality of radio frequency channels.

18. The multicarrier radio frequency transmitter of claim 16, wherein the first radio frequency module comprises a plurality of frequency upconverters.

19. A method for adjusting peak-to-average power of a radio frequency signal, the method comprising the steps of:

combining a first group of radio frequency, channels and a second group of radio frequency channels to produce a first combined signal;

changing the phase of the first group of radio frequency channels to produce a group of phase-adjusted channels;

combining the group of phase-adjusted channels and the second group of radio frequency channels to produce a second combined signal;

selecting one of the first and second combined channels; and outputting the selected combined signal.

20. The method of claim 19, further comprising the steps of measuring a first peak value of the first combined signal and measuring a second peak value of the second combined signal.

21. The method of claim 20, wherein the step of selecting one of the first and second combined channels is based on at least one of the first and second peak values.

22. The method of claim 19, further comprising the step of amplifying the selected combined signal.

* * * * *